(12) United States Patent
Okuyama et al.

(10) Patent No.: US 10,877,071 B2
(45) Date of Patent: Dec. 29, 2020

(54) CURRENT SENSOR

(71) Applicant: Hitachi Metals, Ltd., Tokyo (JP)

(72) Inventors: Ken Okuyama, Tokyo (JP); Katsuya Akimoto, Tokyo (JP); Naoki Futakuchi, Tokyo (JP); Haruyasu Komano, Tokyo (JP); Jun Umetsu, Tokyo (JP); Yujiro Tomita, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 34 days.

(21) Appl. No.: 16/157,257

(22) Filed: Oct. 11, 2018

(65) Prior Publication Data

US 2019/0187183 A1 Jun. 20, 2019

(30) Foreign Application Priority Data

Dec. 18, 2017 (JP) .................................. 2017-241949

(51) Int. Cl.
*G01R 15/14* (2006.01)
*G01R 19/00* (2006.01)
*G01R 15/20* (2006.01)

(52) U.S. Cl.
CPC ......... *G01R 15/148* (2013.01); *G01R 15/207* (2013.01); *G01R 19/0092* (2013.01)

(58) Field of Classification Search
None
See application file for complete search history.

(56) References Cited

U.S. PATENT DOCUMENTS

2014/0015516 A1* 1/2014 Sorensen ............. G01R 15/181
  324/127
2016/0258985 A1* 9/2016 Nomura .................. G01R 33/09

FOREIGN PATENT DOCUMENTS

JP 2010-014477 A 1/2010

* cited by examiner

*Primary Examiner* — Jermele M Hollington
*Assistant Examiner* — Suresh K Rajaputra
(74) *Attorney, Agent, or Firm* — Scully, Scott, Murphy & Presser, PC

(57) ABSTRACT

A current sensor includes three bus bars arranged in such a manner to be spaced and aligned in a width direction thereof. A first shield plate and a second shield plate, which are made of a magnetic material, are arranged in such a manner to sandwich the three bus bars therebetween together in a thickness direction perpendicular to the width direction. Three magnetic detection elements are arranged between the three bus bars respectively and the first shield plate to detect a magnetic field strength generated by currents flowing through the corresponding bus bars. A conductive plate is disposed between each of the magnetic detection elements and the first shield plate. The conductive plate is disposed in such a manner to sandwich the three bus bars together between the conductive plate and the second shield plate. The conductive plate is made of a nonmagnetic conductive material.

10 Claims, 3 Drawing Sheets

US 10,877,071 B2

CURRENT SENSOR

CROSS-REFERENCE TO RELATED APPLICATIONS

The present application is based on Japanese patent application No. 2017-241949 filed on Dec. 18, 2017, the entire contents of which are incorporated herein by reference.

BACKGROUND OF THE INVENTION

1. Field of the Invention

The present invention relates to a current sensor.

2. Description of the Related Art

Conventionally, there is known a current sensor including a magnetic detection element for detecting the strength of a magnetic field generated by a current to be measured (see, e.g., JP-A-2010-14477). By detecting the strength of the magnetic field with the magnetic detection element, it is possible to calculate the current, based on the strength of the magnetic field.

SUMMARY OF THE INVENTION

Now, three-phase alternating current is transmitted between an inverter and a motor. In the inverter that performs PWM (Pulse Width Modulation) control, pulsed currents are output to each phase. Therefore, e.g., in a current sensor that measures the respective phase currents of the three-phase alternating currents transmitted between the inverter that performs PWM control and the motor, the responsiveness to the currents, in other words, the pulse responsiveness is required to be good.

Accordingly, it is an object of the present invention to provide a current sensor having excellent pulse response.

In order to solve the above problem, the present invention provides a current sensor, comprising:

three bus bars, each of which is formed in a plate shape and through which respective phase currents of three-phase alternating currents respectively flow, the three bus bars being arranged in such a manner to be spaced and aligned in a plate width direction thereof;

a first shield plate and a second shield plate, which are made of a magnetic material, the first shield plate and the second shield plate being arranged in such a manner to sandwich the three bus bars therebetween together in a thickness direction perpendicular to the plate width direction;

three magnetic detection elements arranged between the three bus bars respectively and the first shield plate to detect a magnetic field strength generated by the currents flowing through the corresponding bus bars; and a conductive plate disposed between each of the magnetic detection elements and the first shield plate, the conductive plate being disposed in such a manner to sandwich the three bus bars together between the conductive plate and the second shield plate, the conductive plate being made of a nonmagnetic conductive material.

Points of the Invention

According to the present invention, it is possible to provide the current sensor with good pulse response.

DETAILED DESCRIPTION OF THE PREFERRED EMBODIMENTS

Embodiment

An embodiment of the present invention will be described below with reference to the accompanying drawings.

Figure 1A:
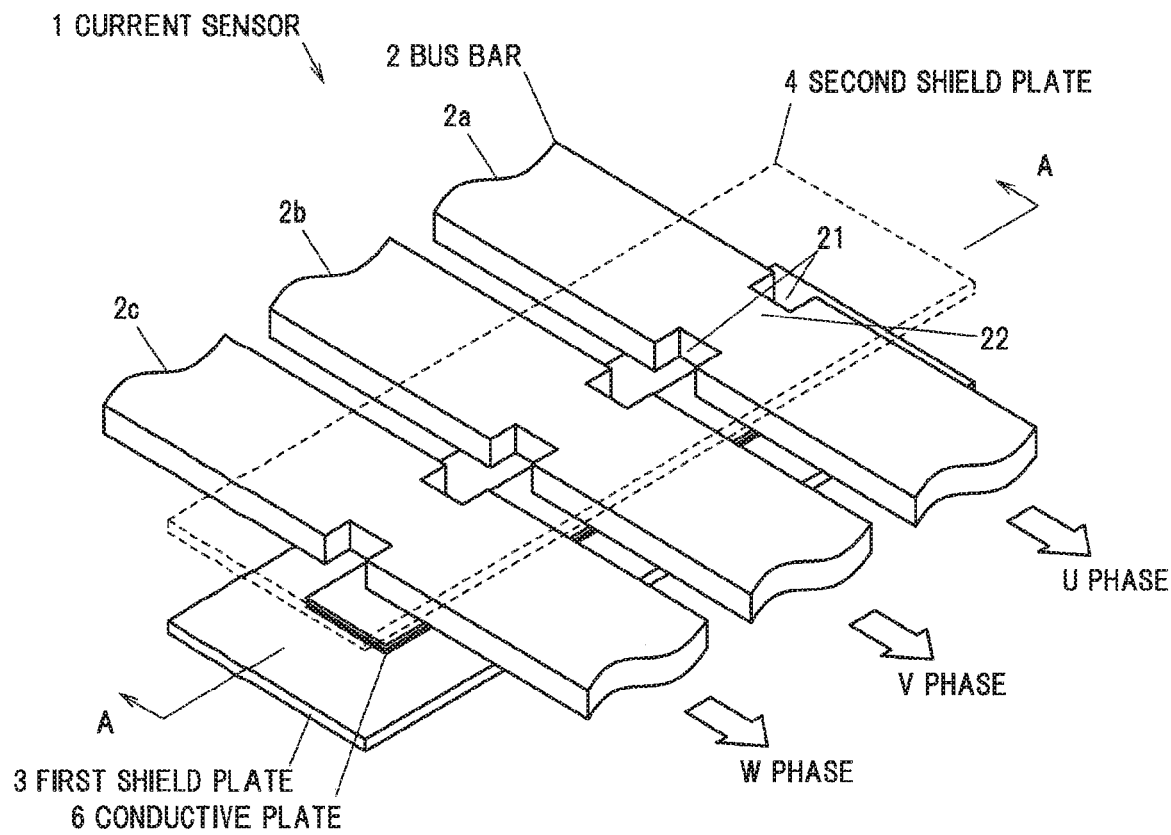
FIG. 1A is a perspective view through a second shield plate showing a current sensor according to an embodiment of the present invention.
Figure 1B:
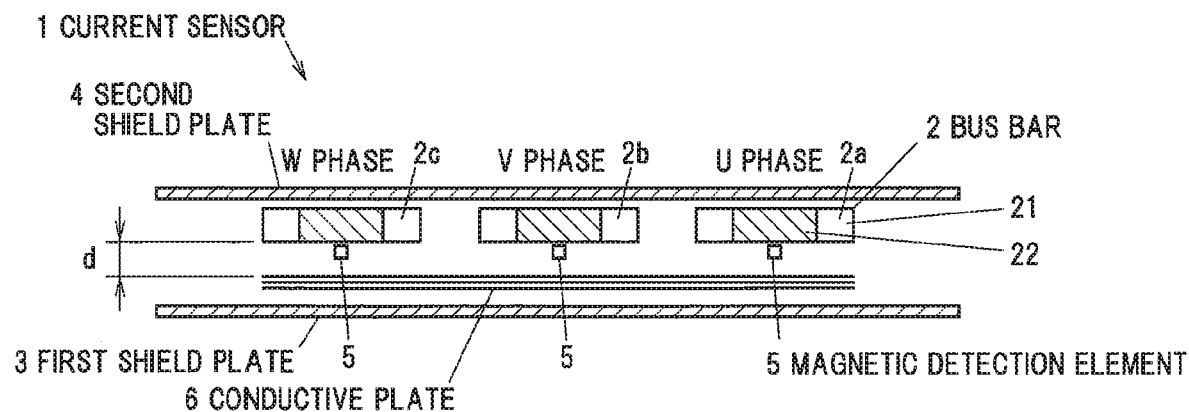
FIG. 1B is a cross-sectional view taken along line A-A in FIG. 1A.

FIG. 1A is a perspective view through a second shield plate showing a current sensor according to an embodiment of the present invention, and FIG. 1B is a cross-sectional view taken along line A-A in FIG. 1A The current sensor 1 includes three bus bars 2, a first shield plate 3, a second shield plate 4, three magnetic detection elements 5, and a conductive plate 6.

Each bus bar 2 is a plate-like conductor made of a good electrical conductor such as copper or aluminum, and serves as a current path through which a current flows. The bus bars 2 are used as, e.g., a power supply line between a motor and an inverter in an electric vehicle or a hybrid vehicle. In the present embodiment, a case where the three bus bars 2a to 2c corresponding to three-phase alternating currents are used will be described. The three bus bars 2a to 2c are arranged in such a manner to be spaced and aligned in a plate width direction thereof.

Hereinafter, in FIG. 1B, the lateral direction is referred to as a width direction, the vertical direction is referred to as a thickness direction, and the paper plane direction is referred to as a length direction. In the current sensor 1, the bus bar 2a, the bus bar 2b, and the bus bar 2c are, in turn, arranged from one side in the width direction to the other side (from the right side to the left side in FIG. 1B). In each bus bar 2a to 2c, respective phase currents of the three-phase alternating currents respectively flow. In the present embodiment, a U phase current flows through the bus bar 2a, a V phase current flows through the bus bar 2b, and a W phase current flows through the bus bar 2c. The thicknesses of the bus bars 2a to 2c are set at 3 mm.

Two notches 21 are formed in each bus bar 2a to 2c. The two cutouts 21 are formed in such a manner to be open toward both sides, respectively, in the width direction of the bus bars 2a to 2c, and are formed opposite each other in the width direction at substantially the same positions in the length direction. By forming the two cutouts 21 in each bus bar 2a to 2c, a narrow width portion 22 in which a portion in the longitudinal direction of the bus bar 2a to 2c is narrowed in width is formed. In the present embodiment, a magnetic detection element 5 is disposed opposite the narrow width portion 22 in the thickness direction.

The narrow width portion 22 acts to suppress the influence of the skin effect at high frequencies and contributes to improvement in detection accuracy. More specifically, when a high frequency current flows through the bus bars 2, the current distribution is biased toward the surfaces of the bus bars 2 due to the skin effect. Since the skin thickness differs depending on the frequency and the current distribution inside the bus bars 2 changes, the magnetic flux density at the position of the magnetic detection element 5 changes. When arranging the magnetic detection element 5 opposite the central portion in the width direction of the bus bars 2, when viewed from the magnetic detection element 5 side, the smaller the aspect ratios of the cross-sectional shapes of the current-carrying surfaces of the bus bars 2, the smaller the spread of the current distribution (in other words, the frequency dependence of the current distribution), so the influence of the skin effect is considered to be small.

The magnetic detection elements 5 are disposed between the bus bars 2a to 2c respectively and the first shield plate 3 to detect a magnetic field strength generated by the currents flowing through the corresponding bus bars 2a to 2c. As the magnetic detection elements 5, e.g., a Hall element, a GMR (Giant Magneto Resistive effect) element, an AMR (Anisotropic Magneto Resistive) element, a TMR (Tunneling Magneto Resistive) element, or the like can be used.

The magnetic detection elements 5 are configured to output an output signal of a voltage dependent on the strength of the magnetic field (the magnetic flux density) in the direction along the detection axis. In the present embodiment, each magnetic detection element 5 is arranged in such a manner that the detection axis coincides with the width direction (the left-right direction in FIG. 1B) of the bus bars 2.

The first shield plate 3 and the second shield plate 4 are for shielding an external magnetic field so that the magnetic field from the outside does not affect the detection results of the magnetic detection elements 5. The first shield plate 3 and the second shield plate 4 are made of a magnetic material. The first shield plate 3 and the second shield plate 4 are formed in a rectangular plate shape having two sides opposite each other in the width direction and two sides opposite each other in the length direction.

The first shield plate 3 and the second shield plate 4 are spaced apart from the bus bars 2 in such a manner to sandwich the three bus bars 2a to 2c therebetween together in the thickness direction. In addition, the first shield plate 3 and the second shield plate 4 are arranged in such a manner that their surfaces are parallel to the surfaces of the bus bars 2 (the thickness direction of the first shield plate 3 and the second shield plate 4 and the thickness direction of the bus bars 2 coincide with each other).

In the current sensor 1, the distances (distances along the thickness direction) of the first shield plate 3 and the second shield plate 4 from the magnetic detection elements 5 are substantially equal. In other words, in the current sensor 1, the magnetic detection elements 5 are arranged at a substantially intermediate position between the first shield plate 3 and the second shield plate 4 (a position where the distances between them and the first shield plate 3 and the second shield plate 4 are substantially equal).

The conductive plate 6 is for changing the frequency characteristic of the strength of the magnetic field detected by the magnetic detection elements 5 due to the influence of the eddy current generated in the conductive plate 6, to thereby ensure improvement in the pulse responsiveness. The conductive plate 6 is made of a nonmagnetic conductive material such as copper or aluminum. The conductive plate 6 is formed in a rectangular plate shape having two sides opposite each other in the width direction and two sides opposite in the length direction. In addition, the conductive plate 6 is disposed in such a manner that its surface is parallel to the surfaces of the bus bars 2.

Note that when a magnetic material is used as the conductive plate 6, the conductive plate 6 functions as a shield, and a redesign of the shield structure including the shield plates 3 and 4 is required. By using a nonmagnetic material as the conductive plate 6, it is possible to ensure improvement in the pulse responsiveness only by adding the conductive plate 6 without changing the shield structure from the existing one.

The conductive plate 6 is disposed between each magnetic detection element 5 and the first shield plate 3. In addition, the conductive plate 6 is disposed in such a manner to sandwich the three bus bars 2 together between the conductive plate and the second shield plate 4. Both end portions of the conductive plate 6 in the width direction coincide with outer end portions in the width direction of the bus bars 2a and 2c, or protrude outward beyond the outer end portions in the width direction of the bus bars 2a and 2c. If the end portions in the width direction of the conductive plate 6 are located on the inner side relative to the outer end portions in the width direction of the bus bar 2a or 2c, the distribution of the eddy current generated in the conductive plate 6 changes, and no sufficient pulse responsiveness may be obtained.

Although it is possible to obtain the advantageous effect even if only one conductive plate 6 is used, by using a plurality of the conductive plates 6, the pulse responsiveness can be further improved. In the present embodiment, the case of using three (three layers) of the conductive plates 6 is shown. In the case of using a plurality of the conductive plates 6, it is preferable that the conductive plates 6 are disposed spaced apart from each other in the thickness direction, and are electrically insulated from each other. For example, a film-like or plate-like insulator may be disposed between the conductive plates 6, or the conductive plates 6 may be disposed spaced apart from each other with an air layer interposed therebetween.

In the present embodiment, a copper plate having a thickness of 0.1 mm is used as the conductive plate 6. However, the conductive plate 6 is not limited thereto, but may be a conductor pattern formed on a substrate, for example. It is also possible to use a multilayer substrate as a substrate (not shown) on which the magnetic detection elements 5 are mounted, and use a conductor pattern formed on one or more layers of the multilayer substrate as the conductive plate 6. This facilitates assembly, and contributes to reduction of the number of parts and cost reduction.

Although not shown, a mold resin is filled between the two shield plates 3 and 4, and both the shield plates 3 and 4, the bus bars 2, the magnetic detection elements 5, and the conductive plate 6 are integrally configured with the mold resin. The mold resin holds the positional relationship between the shield plates 3 and 4, the bus bars 2, the magnetic detection elements 5, and the conductive plate 6 constant and acts both to suppress a detection error due to vibration and the like, and to suppress a detection error due to ingress of foreign matter between the shield plates 3 and 4.

(Explanation of Simulation Results)

When a pulsed current was passed through the bus bar 2b arranged in the middle in the width direction, the waveform of the strength of the magnetic field (magnetic flux density) detected by the magnetic detection element 5 arranged in the middle in the width direction was obtained by simulation.

Note that here, the thickness of each bus bar 2 was set at 3 mm, the width of each bus bar 2 was set at 15 mm, and the pitch between the adjacent bus bars was set at 5.5 mm. Further, the thicknesses of the shield plates 3 and 4 were set at 1 mm, the widths of the shield plates 3 and 4 were set at 76 mm, and the spacing between the shields 3 and 4 was set at 10 mm. The distances between the bus bars 2 and the second shield plate 4 were set at 1 mm. Further, the conductive plate 6 used a copper plate having a thickness of 0.1 mm.

Figure 2:
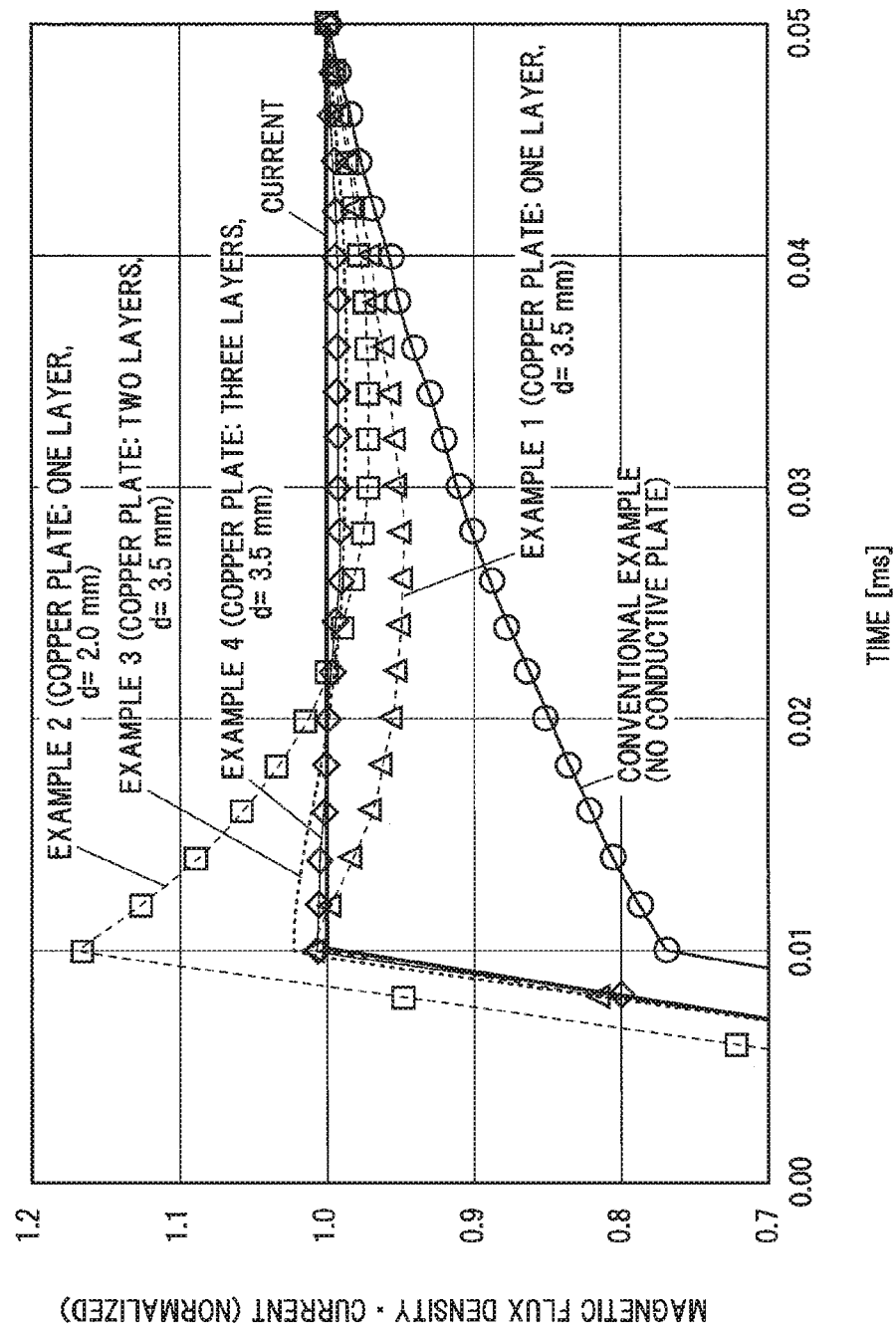
FIG. 2 is a graph showing pulse response characteristics in an embodiment of the present invention and a conventional example.

For each of Example 1 in which one layer of the conductive plate 6 made of a copper plate was used and the distance d between the bus bars 2 and the conductive plate 6 was set at 3.5 mm, Example 2 in which one layer of the conductive plate 6 made of a copper plate was used and the distance d was set at 2.0 mm, Example 3 in which two layers of the conductive plates 6 made of a copper plate were used and the distance d was set at 3.5 mm, Example 4 in which three layers of the conductive plates 6 made of a copper plate were used and the distance d was set at 3.5 mm, and a conventional example in which the conductive plate 6 was omitted, simulation was carried out in the same manner. Results thereof were shown together in FIG. 2. In FIG. 2, a pulse current waveform with a rise time of 0.01 msec was shown and the ordinate axis was normalized at the maximum value. In addition, the time changes of the magnetic flux densities at the positions of the magnetic detection elements 5 with respect to this current waveform were shown in the same figure. The magnetic flux densities were normalized based on the value at 0.05 msec. Also, in the case where the plurality of layers of the conductive plates 6 were used, the distance d was set at the distances between the conductive plate 6 closest to the bus bars 2 and the bus bars 2.

As shown in FIG. 2, the conventional example with no conductive plate 6 did not sufficiently follow the waveform of the current indicated by the thick solid line and the reaction was slow. Compared with this conventional example, in Examples 1 and 2 using the one layer of the conductive plate 6, although some overshoot occurred, the followability to the current was good, and the pulse response was improved. In addition, compared to Examples 1 and 2, the pulse responsiveness of Example 3 in which the two layers of the conductive plates 6 were formed was good. Further, the pulse responsiveness of Example 4 having the three layers of the conductive plates 6 was better than that of Example 3.

From the results shown in FIG. 2, it would be able to be said that the pulse responsiveness was improved when the multiple layers of the conductive plates 6 were formed. It should be noted, however, that since Example 4 with the three layers of the conductive plates 6 substantially followed the behavior of the current, it was considered that the pulse responsiveness improvement effect was small even though the number of the layers was 4 or more. Therefore, it would be able to be said that from the viewpoint of improving the pulse responsiveness, it was desirable that the number of the conductive plates 6 was set at three layers (three) or more, and that further considering cost reduction, it was desirable that the number of the conductive plates 6 was set at three layers (three).

Further, it was understood by the comparison between Example 1 and Example 2 that the pulse response could be improved by changing the position (the distance d) of the conductive plate 6. Regarding the position of the conductive plate 6, depending on the materials and plate thicknesses of the shield plates 3 and 4, the materials and plate thicknesses of the bus bars 2, the positional relationships between the shield plates 3, 4 and the bus bars 2, etc., the position where the pulse responsiveness became good changed. Therefore, it was preferable to determine the position of the conductive plate 6 at an appropriate position in consideration of the materials, positional relationships, and the like of the other members. Note that although not mentioned here, it was considered that the pulse responsiveness could also be improved by changing the plate thickness of the conductive plate 6.

More specifically, the magnitude of the eddy current was greater as the conductivity of the conductive plate 6 was higher. Therefore, the magnitude of the eddy current differed depending on the material of the conductive plate 6. Therefore, the appropriate position (the distance d) of the conductive plate 6 was different depending on the conductivity. In addition, since the skin thickness decreased as the conductivity increased, the eddy current generated in the conductive plate 6 tended to be biased toward the surfaces (the upper and lower surfaces in the thickness direction) and the edge of the conductive plate 6. Therefore, the distribution of the eddy currents in the conductive plate 6 also depended on the outer shape of the conductive plate. Therefore, in applying the conductive plate 6, it was important to optimize the installation position, thickness, and shape of the conductive plate 6 in consideration of the conductivity of the conductive plate 6. For example, paying attention to the thickness of the conductive plate 6, when the thickness was large (thick) as compared with the case where the thickness was small (thin), since the volume through which the magnetic flux passed at low frequencies increased, the effect of the eddy current at low frequencies was considered to be large, which contributed to the improvement in the followability in the flat portion (e.g., the portion after 0.01 ms in FIG. 2) of the current waveform. By forming the multiple layers of the conductive plates 6, the same effect (that is, the effect resulting from the increase in the volume) as in the case where the thickness was increased could be obtained at low frequencies. Furthermore, by forming the multiple layers of the conductive plates 6, eddy current generating areas corresponding to the skin thickness were increased for the high frequency component, and the effects thereof (the magnitude of the influence due to the eddy currents) could be enhanced, which contributed to the improvement in the followability in the rising portion of the current waveform.

Figure 3A:
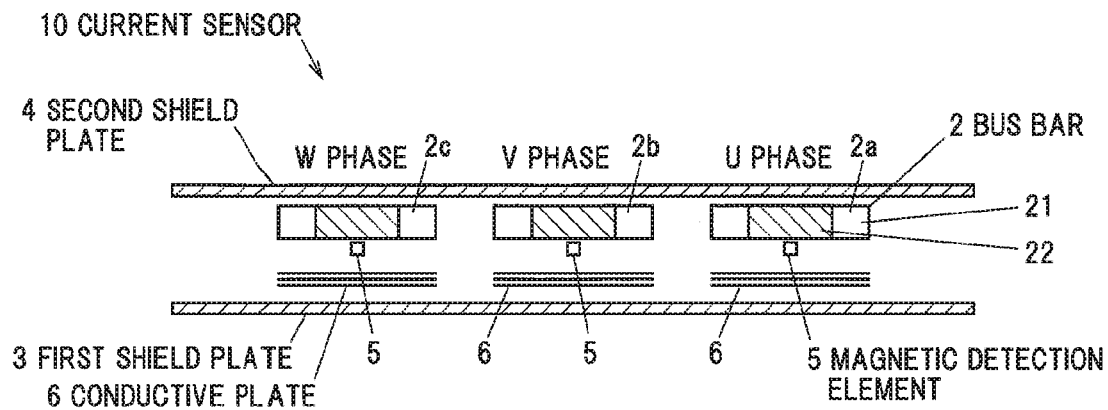
FIG. 3A is a cross-sectional view of a current sensor of a comparative example to be compared with the present invention.

Next, as shown in FIG. 3A, in the current sensor 1 of FIG. 1, the simulation was similarly performed on the current sensor 10 of the comparative example in which the conductive plate 6 was divided into three and the conductive plates 6 were individually provided for each bus bar 2. The results thereof were shown in FIG. 3B. Note that in FIG. 3B, for reference purpose, Example 4 in FIG. 2 and the conventional example were also shown together.

Figure 3B:
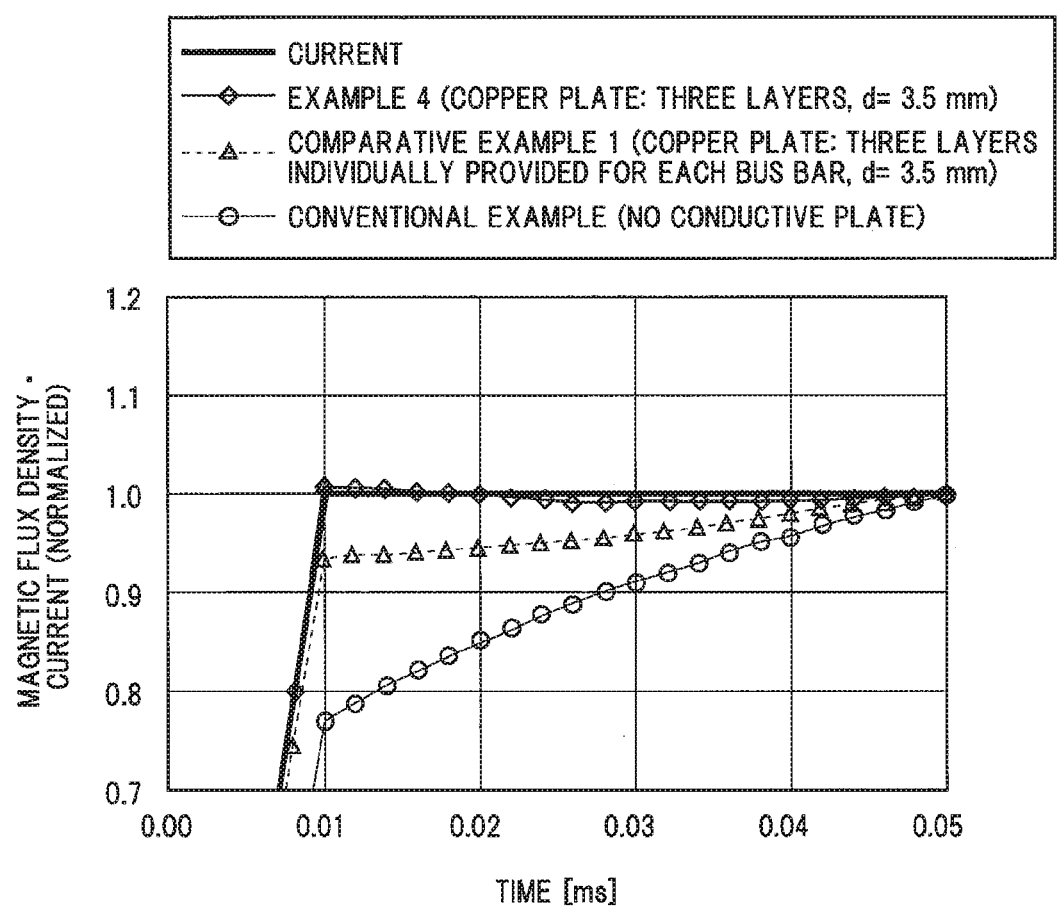
FIG. 3B is a graph showing pulse response characteristics in an embodiment of the present invention, a conventional example, and a comparative example.

As shown in FIG. 3B, it was confirmed that in the current sensor 10 of the comparative example, the pulse responsiveness was improved as compared with the conventional example, but the pulse response was inferior as compared with the example 4 of the present invention. This was considered to be because, by dividing the conductive plate 6, the current distribution of the eddy currents (in particular, the distribution of the high-frequency component susceptible to the influence of the skin effect) was changed, and as a result, the frequency characteristic was deteriorated, and the pulse responsiveness was deteriorated. In this way, by using the common conductive plates 6 for each bus bar 2, the pulse responsiveness was improved as compared with the case where the conductive plates 6 were individually provided for each bus bar 2.

Operation and Advantageous Effects of the Embodiment

As described above, the current sensor 1 according to the present embodiment is provided with the conductive plate 6 disposed between each magnetic detection element 5 and the first shield plate 3, and disposed in such a manner to sandwich the three bus bars 2 together between the conductive plate 6 and the second shield plate 4, and made of a nonmagnetic conductive material.

The magnetic field detected by the magnetic detection elements 5 includes not only the magnetic fields generated by the currents passed through the bus bars 2 but also the magnetic fields generated by the eddy currents in the shield plates 3 and 4 and the magnetic fields due to the eddy currents in the bus bars 2. Therefore, it is considered that the frequency characteristics (frequency dependence) of the strengths of the magnetic fields detected by the magnetic detection elements 5 are influenced by the eddy currents besides the influences of the skin effects of the currents flowing through the bus bars 2.

By providing the conductive plate 6 to generate the magnetic field due to the eddy current in the conductive plate 6 and appropriately adjust that generated magnetic field, it is possible to suppress the influences of the magnetic fields due to the eddy currents generated in the other members at the positions where the magnetic detection elements 5 are provided, and to suppress the frequency dependency (in particular, the deterioration of the sensitivity at high frequencies). As a result, the pulse responsiveness can be improved.

In addition, by providing the common conductive plates 6 for each bus bar 2, it is possible to improve the pulse responsiveness as compared with the case where the conductive plates 6 are individually provided for each bus bar 2, and it is possible to realize the current sensor 1 with high detection accuracy. By using the current sensor 1 of the present invention, it becomes possible to accurately monitor the inverter output waveform.

Summary of the Embodiment

Next, the technical ideas grasped from the above-described embodiments will be described with the aid of reference numerals and the like in the embodiments. It should be noted, however, that each of the reference numerals and the like in the following description does not limit the constituent elements in the claims to the members and the like specifically shown in the embodiments.

[1] A current sensor (1), comprising: three bus bars (2), each of which is formed in a plate shape and through which respective phase currents of three-phase alternating currents respectively flow, the three bus bars (2) being arranged in such a manner to be spaced and aligned in a plate width direction thereof; a first shield plate (3) and a second shield plate (4), which are made of a magnetic material, the first shield plate (3) and the second shield plate (4) being arranged in such a manner to sandwich the three bus bars (2) therebetween together in a thickness direction perpendicular to the plate width direction; three magnetic detection elements (5) arranged between the three bus bars (2) respectively and the first shield plate (3) to detect a magnetic field strength generated by the currents flowing through the corresponding bus bars (2); and a conductive plate (6) disposed between each of the magnetic detection elements (5) and the first shield plate (3), the conductive plate (6) being disposed in such a manner to sandwich the three bus bars (2) together between the conductive plate (6) and the second shield plate (4), the conductive plate (6) being made of a nonmagnetic conductive material.

[2] The current sensor (1) according to [1] above, including a plurality of the conductive plates (6), wherein the plurality of the conductive plates (6) are arranged in a spaced-apart manner in a thickness direction and are electrically insulated from each other.

[3] The current sensor (1) according to [2] above, including three or more of the conductive plates (6).

[4] The current sensor (1) according to any one of [1] to [3] above, wherein the conductive plate (6) comprises a conductor pattern formed on a substrate.

Although the embodiment of the present invention has been described above, the embodiment described above does not limit the invention according to the claims. It should also be noted that not all combinations of the features described in the embodiments are indispensable to the means for solving the problem of the invention. Further, the present invention can be appropriately modified and carried out within the scope not deviating from the spirit thereof.

What is claimed is:

1. A current sensor, comprising:
three bus bars, each of which is formed in a plate shape and through which respective phase currents of three-phase alternating currents respectively flow, the three bus bars being arranged in such a manner to be spaced and aligned in a plate width direction thereof;
a first shield plate and a second shield plate, which are made of a magnetic material, the first shield plate and the second shield plate being arranged in such a manner to sandwich the three bus bars therebetween together in a thickness direction perpendicular to the plate width direction;
three magnetic detection elements arranged between the three bus bars respectively and the first shield plate to detect a magnetic field strength generated by the currents flowing through the corresponding bus bars; and
a conductive plate commonly disposed between the magnetic detection elements and the first shield plate, the conductive plate being disposed in such a manner to collectively sandwich the three bus bars together between the conductive plate and the second shield plate, the conductive plate being made of a nonmagnetic conductive material.

2. The current sensor according to claim 1, including a plurality of the conductive plates, wherein the plurality of the conductive plates are arranged in a spaced-apart manner in a thickness direction and are electrically insulated from each other.

3. The current sensor according to claim 2, including three or more of the conductive plates.

4. The current sensor according to claim 1, wherein the conductive plate comprises a conductor pattern formed on a substrate.

5. The current sensor according to claim 1, wherein the conductive plate is separated from the three magnetic detection elements by a distance d, where d is greater than zero.

6. The current sensor according to claim 5, wherein a spacer material is provided between the conductive plate and the three magnetic detection elements.

7. The current sensor according to claim 6, wherein a spacer material is made of a resin.

8. The current sensor according to claim 1, wherein the three bus bars are arranged with two outer bus bars and one inner bus bar.

9. The current sensor according to claim 8, wherein opposite end portions of the conductive plate in the width direction coincide with opposite end portions in the length direction of the two outer busbars.

10. The current sensor according to claim 8, wherein opposite end portions of the conductive plate in the width direction protrude outward beyond the outer end portions in the length direction of the two outer bus bars.

* * * * *